United States Patent
Heinz et al.

(10) Patent No.: US 6,333,587 B1
(45) Date of Patent: Dec. 25, 2001

(54) PIEZOELECTRIC ACTUATOR

(75) Inventors: Rudolf Heinz, Renningen; Bertram Sugg, Gerlingen, both of (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/622,027

(22) PCT Filed: Dec. 3, 1999

(86) PCT No.: PCT/DE99/03873

§ 371 Date: Aug. 31, 2000

§ 102(e) Date: Aug. 31, 2000

(87) PCT Pub. No.: WO00/36657

PCT Pub. Date: Jun. 22, 2000

(30) Foreign Application Priority Data

Dec. 11, 1998 (DE) .............................. 198 57 247

(51) Int. Cl.[7] .................................................. H01L 41/04
(52) U.S. Cl. .......................... 310/328; 310/341; 310/346
(58) Field of Search ..................................... 310/328, 340, 310/341, 346

(56) References Cited

U.S. PATENT DOCUMENTS

| | | | |
|---|---|---|---|
| 3,598,506 | * | 8/1971 | O'Neill ................................ 417/383 |
| 4,011,474 | * | 3/1977 | O'Neill ................................ 310/328 |
| 4,752,712 | * | 6/1988 | Tomita et al. ....................... 310/328 |
| 5,239,223 | * | 8/1993 | Miyoshi .............................. 310/328 |
| 5,389,851 | * | 2/1995 | Kimura et al. ...................... 310/328 |
| 6,172,445 | * | 1/2001 | Heinz et al. ........................ 310/328 |

FOREIGN PATENT DOCUMENTS

| | | | |
|---|---|---|---|
| 01-027228 | * | 8/1990 | (JP) . |
| 03-060082 | * | 3/1991 | (JP) . |
| 05-218519 | * | 8/1993 | (JP) . |
| 08-172227 | * | 7/1996 | (JP) . |
| 11-214760 | * | 8/1999 | (JP) . |
| 2000-022228 | * | 1/2000 | (JP) . |
| 2000-134958 | * | 5/2000 | (JP) . |

* cited by examiner

Primary Examiner—Karl Tamai
Assistant Examiner—Peter Medley
(74) Attorney, Agent, or Firm—Ronald E. Greigg

(57) ABSTRACT

The invention relates to a piezoelectric actuator in particular for actuating control valves or injection valves in internal combustion engines in motor vehicles, having a piezoelectric actuator body, in particular in the form of a multilayer laminate of stacked layers of piezoelectric material and intervening metal or electrically conductive layers acting as electrodes, in which one of the face ends of the actuator body is fixed on a highly heat-conducting or metal actuator base, in which the piezoelectric actuator includes at least one highly heat-conductive cooling body joined highly heat-conductingly to the side faces of the actuator body and to the actuator base.

19 Claims, 2 Drawing Sheets

PIEZOELECTRIC ACTUATOR

BACKGROUND OF THE INVENTION

The invention is directed to improvements in a piezoelectric actuators, in particular for actuating control valves or injection valves in internal combustion engines in motor vehicles, having a piezoelectric actuator body, in particular in the form of a multilayer laminate of stacked layers of piezoelectric material and intervening metal or electrically conductive layers acting as electrodes, in which one of the face ends of the actuator body is fixed on a highly heat-conducting or metal actuator base.

One such piezoelectric actuator is disclosed in German Patent Disclosure DE 196 50 900 A1 of Robert Bosch GmbH.

As is well known, piezoelectric actuators can for instance be used for injection valves of a vehicle motor and in brake systems with anti-lock and traction control systems.

Such injection valves equipped with piezoelectric actuators have an injection nozzle controlled by a tappetlike closure device. An operative face toward the nozzle is disposed on the tappet and is acted upon by the pressure of the fuel supplied to the nozzle; the pressure forces seek to urge the tappet in the opening direction of the closure device. The tappet protrudes with a plungerlike end, whose cross section is larger than the aforementioned operative face, into a control chamber. The pressure effective there seeks to urge the tappet in the closing direction of the closure device. The control chamber communicates with the fuel supply, which is at a high pressure, via an inlet throttle and with a fuel return line that has only low pressure, via an outlet valve that is throttled as a rule or is combined with an outlet throttle. When the outlet valve is closed, a high pressure prevails in the control chamber, by which the tappet is moved in the closing direction of the closure device, counter to the pressure on its operative face toward the nozzle, or is kept in the closing position. Upon opening of the outlet valve, the pressure in the control chamber drops; the magnitude of the drop in pressure is determined by the size of the inlet throttle and by the throttle resistance of the opened outlet valve, or the outlet throttle combined with it. As a result, the pressure in the control chamber decreases when the outlet valve is opened, in such a way that the tappet is moved in the opening direction of the closure device, or held in the open position, by the pressure forces that are operative on its operative face toward the nozzle.

In comparison with electromagnetically actuated injection valves, piezoelectric actuators can switch faster. However, in the design of a piezoelectric actuator, it must be noted that internal losses in the piezoelectric body of the actuator cause lost heat, which has to be dissipated so that the actuator will not overheat. Since the ceramic materials of the piezoelectric ceramic have poorer heat conductivity, the dissipation inside the actuator body, which substantially comprises ceramic material, is unfavorable, especially in long actuators, whose length is greater than their width.

OBJECT OF THE INVENTION

It is therefore the object of the invention to make a piezoelectric actuator, in particular a long one, according to the invention possible in such a way that cooling during its operation can be done without liquid media, that simple mounting of the piezoelectric actuator is possible, and that neither liquid coolants nor special seals are necessary.

SUMMARY OF THE INVENTION

A piezoelectric actuator according to the invention thus avoids overheating caused by the power loss from it, makes do without liquid coolant media and without the seals and coolant paths required for them, so that leakage of such coolants is not possible, and the mounting of the piezoelectric actuator is simplified and the piezoelectric actuator can be produced economically as a result.

The invention resides in the fact that at least one cooling body with good thermal conductivity is joined highly heat-conductively to the side faces of the actuator body and to the actuator base.

In the invention, it is advantageous to be providing that the electric lead lines to the metal or electrically conductive electrodes of the actuator body, embodied as a multi-layer laminate, are extended to the actuator body on only two sides thereof, so that the two other opposed side faces of the actuator body remain free and can be joined highly heat-conductively to the aforementioned cooling body or cooling bodies.

Preferably, the cooling body or cooling bodies comprise metal, and especially preferably copper.

Either two separate cooling bodies, or a single U-shaped cooling body designed such that it is joined on the bottom portion of its U to the face end of the actuator body pointing toward the actuator base, can be joined to the two opposed side faces of the actuator body. This joining is preferably done by an elastic, heat-conductive adhesive between the cooling body and the side faces of the actuator body. A heat-conductive adhesive of this kind comprises a silicone elastomer, for instance, which is optionally filled with an electrically insulating, heat-conductive filler, such as AlN or $Al_2O_3$.

To allow the expansion or shrinkage of the actuator body when the electric voltage is applied, without tearing of the elastic, heat-conductive adhesive, the portions of the cooling body or bodies that border on the side faces of the actuator body can be corrugated, or in other words can have the form of a metal corrugated band.

To utilize the good thermal conductivity of the cooling body or cooling bodies and to dissipate the heat carried by them, the cooling body or cooling bodies are soldered or welded to the actuator base, or alternatively joined to it thermally conductively by means of a silver conductive adhesive. Thus the lost heat generated by the piezoelectric actuator is reliably dissipated from the cooling body to the actuator base, which is a good thermal conductor.

If an actuator body is used whose two face ends are each prestressed by a band spring, and the band springs are located along the side faces not covered by the cooling bodies, spaced apart from the actuator body, it is also recommended that the band springs be used for heat dissipation as well, since they are also fixed to the actuator base. To that end, the interstices between the actuator body and the band springs are filled with heat-conductive elastomer, optionally with the addition of a heat-conductive filler. Furthermore, the electrical terminals of the electrodes of the piezoelectric actuator body can additionally be used for heat dissipation, if these electrical connection lines have an adequately large line cross section.

It should be noted that the shapes mentioned above for the cooling body or bodies are merely examples, and that other expedient shapes can be used, for instance with actuator bodies of round cross section.

Various exemplary embodiments of a piezoelectric actuator designed according to the invention will be described in further detail below in conjunction with the drawings.

DESCRIPTION OF PREFERRED EMBODIMENTS

Figure 1:
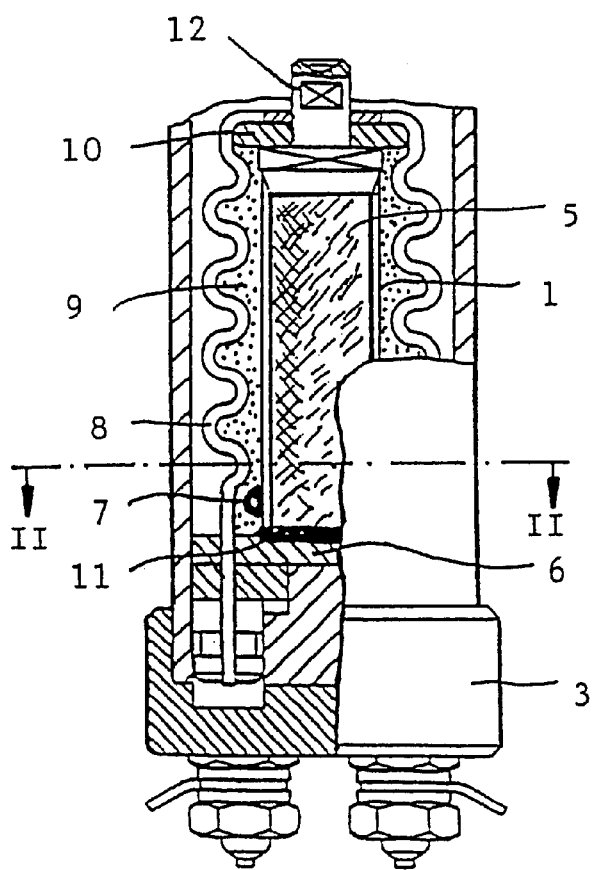
FIG. 1, schematically and in the form of a fragmentary section, shows a first exemplary embodiment of a piezoelectric actuator.

FIG. 1, shows a first exemplary embodiment, in a fragmentary longitudinal section, of a piezoelectric actuator of the invention, having an actuator body 1, which can take the form of a multi-layer laminate of stacked layers of piezoelectric material and intervening metal or electrically conductive layers acting as electrodes. The actuator body is fastened between an upper ring flange 10 and an actuator base 6 by two corrugated spring bands 8. The actuator body 1 with the corrugated spring bands 8 is seated in a metal housing 3, on the underside of which clamps are mounted for connection to electrode lead lines 7.

If the actuator body 1 is acted upon at its electrodes by a pulsating electrical voltage, it executes similarly pulsating strokes, thus changing the spacing between its end faces that are fastened between the ring flange 10 and the actuator base 6 by the spring bands 8.

The heat produced in actuator operation can be dissipated only to a slight extent upward through the ring flange 10 and the extension 12 of the tappet plate located below it. Moreover, because of the poor thermal conductivity of the ceramic used for the actuator body 1, in the case of actuators which as shown in FIG. 1 have a length greater than their width, the dissipation of the heat inside the ceramic of the actuator body 1 is unfavorable.

For this reason, a metal or preferably copper cooling body 5 is joined highly heat-conductively, i.e., in such a way as to conduct heat well, to the side faces of the actuator body 1 and to the actuator base 6. This connection that conducts heat well is embodied by a soldered or welded seam 11 in the exemplary embodiment shown in FIG. 1. It should be noted that on the opposite side of the actuator body 1, which cannot be seen in FIG. 1, an identical cooling body 5 is provided. In the exemplary embodiment shown in FIG. 1, the interstices between the side faces of the actuator body 1 that are perpendicular to the plane of the drawing and the spring bands 8 are also filled with a heat-conductive elastomer 9, to which a heat-conductive filler is added. As a result, the heat is additionally dissipated by the spring band 8 to the actuator base 6, with which the band springs 8 are connected thermally conductively.

Figure 2:
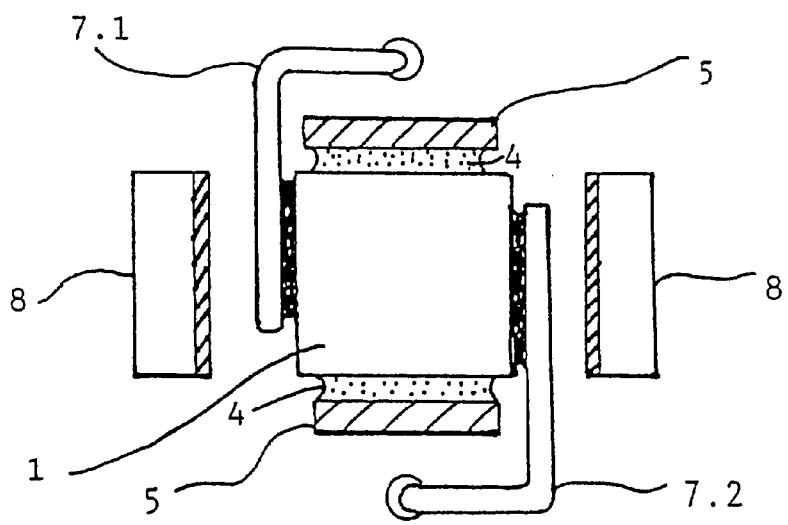
FIG. 2 shows a cross section through the embodiment shown in FIG. 1, of the piezoelectric actuator of the invention, taken along the section line II—II.

The cross-sectional view shown in FIG. 2 of the exemplary embodiment shown in FIG. 1, taken along the line II—II in FIG. 1, shows that the cooling bodies 5 are glued to two opposed side faces of the actuator body 1, which here has a square cross section, by means of an elastic, heat-conductive adhesive 4. This heat-conductive adhesive 4 for instance comprises silicone elastomer that is filled with a heat-conductive filler. Silicone elastomer has the advantage of being highly elastic, and thus it elastically equalizes the strokes of the actuator body 1. The cross-sectional view in FIG. 2 also shows that the electrode lead lines 7.1, 7.2 lead to the side faces of the actuator body 1 that are not covered by the cooling body 5.

The shape and manner of fastening the cooling body or cooling bodies 5 to the actuator base 6, in such a way that a good heat-conductive connection between the cooling body 5 and actuator base 6 is created, can vary, as will be described below in terms of FIGS. 3A through 3E.

Figure 3:
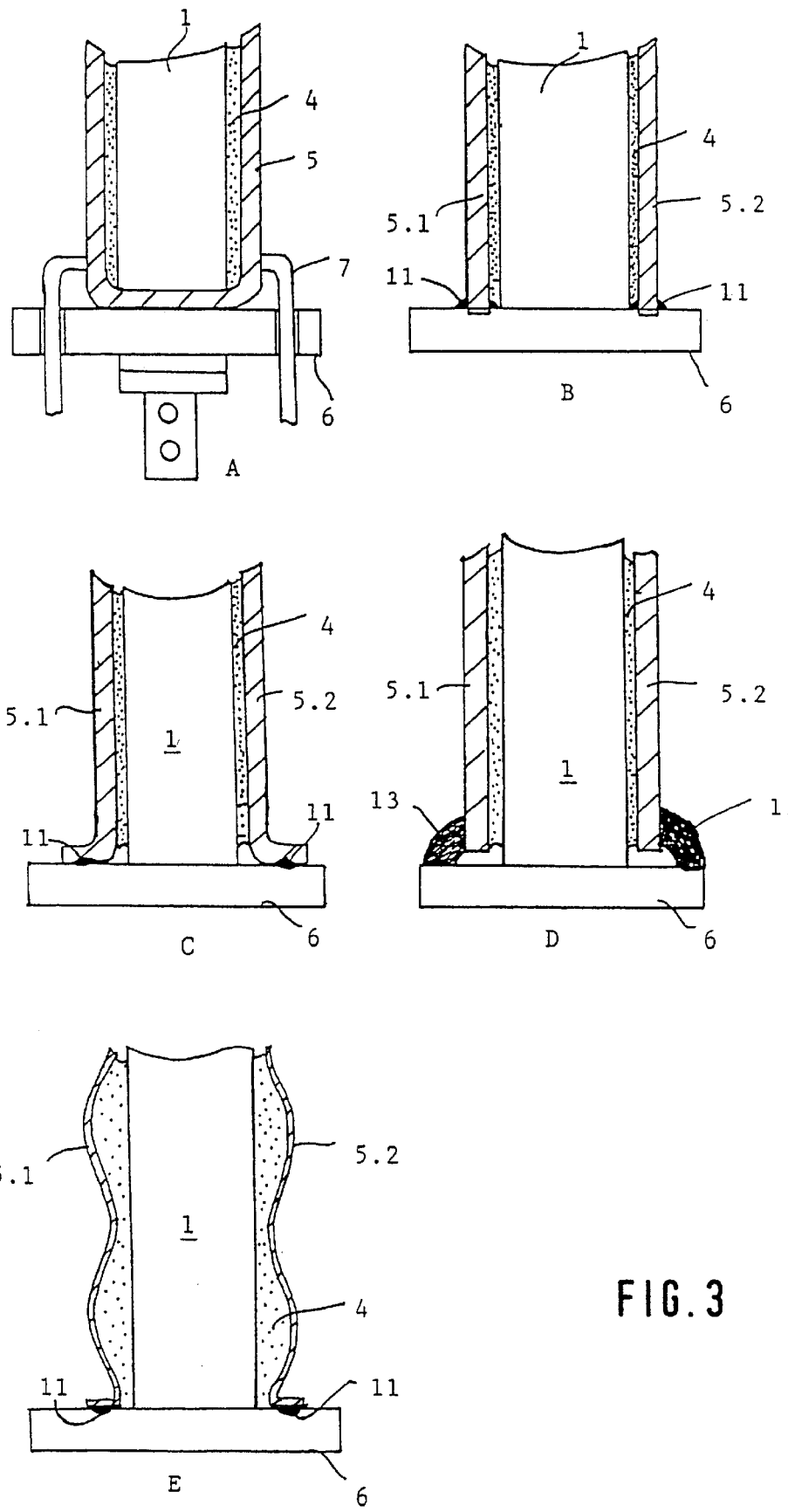
FIGS. 3A through 3E show various further embodiments of the cooling body provided according to the invention.

In FIG. 3A, a one-piece metal cooling body 5 bent into a U, preferably made of copper, is secured heat-transmittingly to the actuator base 6 by the base of the U-shaped profile.

In FIG. 3B, a left cooling body 5.1 and right cooling body 5.2 are joined heat-conductively to the actuator base 6 by a soldered or welded connection 11.

In FIG. 3C as well, a left cooling body 5.1 and a right cooling body 5.2 are each joined heat-conductively to the actuator base 6 by a soldered or welded connection 11, but the lower portions of the cooling bodies 5.1, 5.2 are bent outward.

The exemplary embodiment shown in FIG. 3D differs from that described thus far in that two cooling bodies 5.1 and 5.2 are joined heat-conductively to the actuator base 6 by silver conductive adhesive 13.

In the exemplary embodiment shown in FIG. 3E, a left cooling body 5.1 and a right cooling body 5.2 are embodied in the form of a corrugated band and are joined heat-conductively to the actuator base 6 by a soldered or welded connection 11. The elastic metal corrugated bands 5.1 and 5.2 acting as cooling bodies have the effect that each cooling body can elastically follow along with the actuator strokes. This reduces the stress on the adhesive 4.

In all the exemplary embodiments shown in FIGS. 3A through 3E, an elastic heat-conductive adhesive, such as silicone elastomer, can be used to join the cooling body 5 or cooling bodies 5.1, 5.2 to the actuator body 1. This silicone elastomer adhesive can be filled with heat-conductive filler.

As has already been explained above in terms of the exemplary embodiment shown in FIG. 1, the band springs 8 can additionally be utilized for laterally dissipating heat from the actuator body 1, by filling the interstices between the actuator body 1 and the spring band 8 with heat-conductive elastomer.

As a further, additional heat dissipation possibility, the electrode leads 7 can also be used, if they have a sufficiently large cable cross section.

In summary, with the above-described metal cooling body or cooling bodies, the dissipation of heat from the piezoelectric actuator is made possible without requiring liquid coolants. This makes the actuator easier to install, and no leaks can occur. No special seals are necessary, and the entire piezoelectric actuator module can as a result be manufactured economically.

A piezoelectric actuator designed according to the invention can be used for example for actuating the injection valves for a common rail injection system in Diesel-powered passenger cars or commercial vehicles.

The foregoing relates to a preferred exemplary of embodiments of the invention, it being understood that other variants and embodiments thereof are possible within the spirit and scope of the invention, the latter being defined by the appended claims.

What is claimed is:

1. A piezoelectric actuator for actuating control valves or injection valves in internal combustion engines in motor vehicles, having a piezoelectric actuator body (1), in the form of a multilayer laminate of layered plies of piezoelectric material and intervening electrically conductive layers acting as electrodes, said actuator body having face ends and side faces, one of which face ends is fixed on a highly heat-conducting actuator base (6), and at least one highly heat-conductive cooling body (5; 5.1, 5.2) is joined highly heat-conductively to the side faces of the actuator body (1) and to the actuator base (6).

2. The piezoelectric actuator of claim 1, wherein at least one of said electrically conductive layers and said highly heat conducting actuator base is metallic.

3. The piezoelectric actuator of claim 2, in which said at least one highly heat-conducting cooling body (5; 5.1, 5.2) is of metal, preferably copper.

4. The piezoelectric actuator of claim 1, in which said at least one highly heat-conducting cooling body (5; 5.1, 5.2) is of metal, preferably copper.

5. The piezoelectric actuator of claim 4, in which the actuator body (1) has a rectangular cross section, and the at least one cooling body (5; 5.1, 5.2) is joined to two opposed side faces of the actuator body.

6. The piezoelectric actuator of claim 4, in which the actuator body (1) has a square cross section, and the at least one cooling body (5; 5.1, 5.2) is joined to two opposed side faces of the actuator body.

7. The piezoelectric actuator of claim 1, in which the actuator body (1) has a rectangular cross section, and the at least one cooling body (5; 5.1, 5.2) is joined to two opposed side faces of the actuator body.

8. The piezoelectric actuator of claim 1, in which the actuator body (1) has a square cross section, and the at least one cooling body (5; 5.1, 5.2) is joined to two opposed side faces of the actuator body.

9. The piezoelectric actuator of claim 1, in which said at least one cooling body comprises two separate cooling bodies (5.1 and 5.2) joined to two opposed side faces of the actuator body (1).

10. The piezoelectric actuator of claim 1, in which said at least one cooling body (5) is a single U-shaped cooling body joined to two opposed side faces of the actuator body (1) and to the face end of the actuator body pointing toward the actuator base (6).

11. The piezoelectric actuator of claim 1, in which said at least one cooling body includes portions (5; 5.1, 5.2) that border on the side faces of the actuator body (1) and take the form of a corrugated band.

12. The piezoelectric actuator of claim 1, in which said at least one cooling body (5; 5.1, 5.2) is glued to the opposed side faces of the actuator body (1) with an elastic, thermally conductive adhesive (4).

13. The piezoelectric actuator of claim 12, in which the heat-conductive adhesive (4) comprises a silicone elastomer.

14. The piezoelectric actuator of claim 13, in which the silicone elastomer is filled with heat-conductive filler.

15. The piezoelectric actuator of claim 1, in which the at least one cooling body (5; 5.1, 5.2) is welded to the actuator base (6).

16. The piezoelectric actuator of claim 1, in which the at least one cooling body (5; 5.1, 5.2) is soldered to the actuator base (6).

17. The piezoelectric actuator of claim 1, in which said at least one cooling body 5; 5.1, 5.2) is joined to the actuator base (6) by a silver conductive adhesive.

18. A piezoelectric actuator, provided with an actuator body (1) having side faces and end faces, and having at least one band spring (8) arranged to prestress the two face ends of the actuator body (1), said at least one band spring being spaced apart from the actuator body (1) along the side faces thereof that are not covered by at least one cooling body (5; 5.1, 5.2), said at least one band spring and said actuator body define at least one interstice between the side faces of the actuator body (1) and the band spring (8), which at least one interstice is filled with heat-conductive elastomer.

19. The piezoelectric actuator of claim 18, in which said heat-conductive elastomer is supplied with additional heat conductive filler.

* * * * *